US008649462B2

(12) United States Patent
Jang et al.

(10) Patent No.: US 8,649,462 B2
(45) Date of Patent: Feb. 11, 2014

(54) METHOD AND APPARATUS FOR TRANSMITTING SIGNAL USING REPETITION CODING IN A WIRELESS COMMUNICATION SYSTEM

(75) Inventors: Ji Woong Jang, Anyang-si (KR); Seung Hee Han, Anyang-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/580,351

(22) PCT Filed: Mar. 24, 2011

(86) PCT No.: PCT/KR2011/002032
§ 371 (c)(1),
(2), (4) Date: Aug. 21, 2012

(87) PCT Pub. No.: WO2011/118995
PCT Pub. Date: Sep. 29, 2011

(65) Prior Publication Data
US 2012/0328042 A1    Dec. 27, 2012

Related U.S. Application Data

(60) Provisional application No. 61/317,284, filed on Mar. 25, 2010, provisional application No. 61/318,365, filed on Mar. 28, 2010.

(51) Int. Cl.
*H04L 27/00* (2006.01)
(52) U.S. Cl.
USPC ............................................................ 375/295

(58) Field of Classification Search
USPC ......................................... 375/295, 316, 324
See application file for complete search history.

(56) References Cited

U.S. PATENT DOCUMENTS

| 6,373,951 | B1* | 4/2002 | Jenkins et al. | 380/262 |
| 2007/0019753 | A1 | 1/2007 | Kim | |
| 2010/0239046 | A1* | 9/2010 | Chun et al. | 375/295 |
| 2010/0313098 | A1* | 12/2010 | Lee et al. | 714/752 |
| 2011/0134903 | A1 | 6/2011 | Ko et al. | |
| 2012/0287846 | A1* | 11/2012 | Becker et al. | 370/315 |
| 2012/0320951 | A1* | 12/2012 | Han et al. | 375/141 |
| 2013/0039398 | A1* | 2/2013 | Ko et al. | 375/219 |
| 2013/0223396 | A1* | 8/2013 | Han et al. | 370/329 |

FOREIGN PATENT DOCUMENTS

| KR | 10-2009-0087714 A | 8/2009 |
| WO | WO 2009/031801 A2 | 3/2009 |
| WO | WO 2009/099308 A2 | 8/2009 |
| WO | WO 2010/018922 A2 | 2/2010 |

* cited by examiner

*Primary Examiner* — Jaison Joseph
(74) *Attorney, Agent, or Firm* — Birch, Stewart, Kolasch & Birch, LLP

(57) ABSTRACT

A method and apparatus for transmitting information data using a repetition coding scheme in a wireless communication system are disclosed. The transmission method includes generating a codeword of a predetermined size $N_{encoded}$ by encoding information data of a size $N_{info}$, and transmitting the codeword to a receiver. The codeword includes a plurality of repeated blocks based on the information data and if the information data includes an odd number of 1s, the information data of odd-numbered repeated blocks out of the plurality of repeated blocks are bit-inverted.

10 Claims, 25 Drawing Sheets

FIG. 5
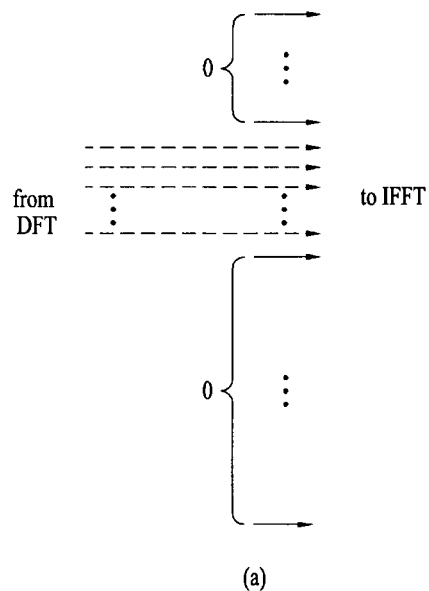
(a)
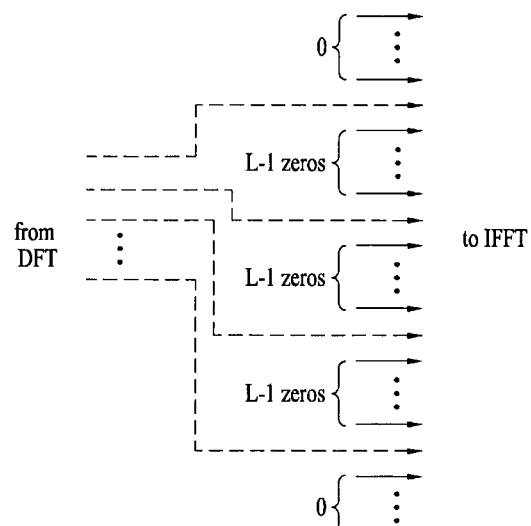
(b)

Extended CP case

FIG. 15

Resource allocation: 18 ACK/NACK channels with normal CP $\Delta_{shift}^{PUCCH} = 2$

| Cell specific cyclic shift offset | | RS orthogonal cover | | | ACK/NACK orthogonal cover | | |
|---|---|---|---|---|---|---|---|
| $\delta_{offset}^{PUCCH} = 1$ | $\delta_{offset}^{PUCCH} = 0$ | $\bar{n}_{OC} = 0$ | $\bar{n}_{OC} = 1$ | $\bar{n}_{OC} = 2$ | $n_{OC} = 0$ | $n_{OC} = 1$ | $n_{OC} = 2$ |
| $n_{CS} = 1$ | $n_{CS} = 0$ | n' = 0 | | 12 | n' = 0 | | 12 |
| 2 | 1 | | 6 | 13 | | 6 | 13 |
| 3 | 2 | 1 | 7 | 14 | 1 | 7 | 14 |
| 4 | 3 | 2 | 8 | 15 | 2 | 8 | 15 |
| 5 | 4 | 3 | 9 | 16 | 3 | 9 | 16 |
| 6 | 5 | 4 | 10 | 17 | 4 | 10 | 17 |
| 7 | 6 | 5 | 11 | | 5 | 11 | |
| 8 | 7 | | | | | | |
| 9 | 8 | | | | | | |
| 10 | 9 | | | | | | |
| 11 | 10 | | | | | | |
| 0 | 11 | | | | | | |

$\Delta_{shift}^{PUCCH} \in \{1,2,3\}$ for normal cyclic prefix
$\{1,2,3\}$ for extended cyclic prefix $\delta_{offset}^{PUCCH} \in \{0,1,...,\Delta_{shift}^{PUCCH} - 1\}$ Cell specific cyclic shift offset $n_{OC}$ Orthogonal sequence index for ACK/NACK
$\bar{n}_{OC}$ Orthogonal sequence index for RS
$n_{CS}$ Cyclic shift value of a CAZAC sequence
n' ACK/NACK resource index used for the channelization in a RB Cell-specific Cyclic shift value of CAZAC sequence

METHOD AND APPARATUS FOR TRANSMITTING SIGNAL USING REPETITION CODING IN A WIRELESS COMMUNICATION SYSTEM

CROSS REFERENCE TO RELATED APPLICATIONS

This application is the National Phase of PCT/KR2011/002032 filed on Mar. 24, 2011, which claims priority under 35 U.S.C. 119(e) to U.S. Provisional Application Nos. 61/317,284 and 61/318,365 filed on Mar. 25, 2010 and Mar. 28, 2010 respectively, all of which are hereby expressly incorporated by reference into the present application.

TECHNICAL FIELD

The present invention relates to a wireless communication system, and more particularly, to a method and apparatus for transmitting a signal using repetition coding in a wireless communication system.

BACKGROUND ART

In a mobile communication system, a User Equipment (UE) can receive information from a Base Station (BS) on a downlink and transmit information to the BS on an uplink. Data that the UE transmits or receives includes data and various types of control information and thus various physical channels are defined according to the types and usages of information transmitted to or received at the UE.

FIG. 1 illustrates physical channels and a method for transmitting signals on the physical channels in a mobile communication system, 3rd Generation Project Partnership Long Term Evolution (3GPP LTE).

Referring to FIG. 1, when a UE is powered on or enters a new cell, the UE performs initial cell search (step S101). The initial cell search involves acquisition of synchronization to a BS. Specifically, the UE synchronizes its timing to the BS and acquires a cell Identifier (ID) and other information by receiving a Primary Synchronization CHannel (P-SCH) and a Secondary Synchronization CHannel (S-SCH) from the BS. Then the UE may acquire information broadcast in the cell by receiving a Physical Broadcast CHannel (PBCH) from the BS. During the initial cell search, the UE may monitor a downlink channel state by receiving a DownLink Reference Signal (DL RS).

After the initial cell search, the UE may acquire detailed system information by receiving a Physical Downlink Control CHannel (PDCCH) and receiving a Physical Downlink Shared CHannel (PDSCH) based on the PDCCH (S102).

If the UE is yet to complete its connection to the BS, the UE may perform a random access procedure to complete the connection (S103 to S106). During the random access procedure, the UE may transmit a predetermined sequence as preamble on a Physical Random Access CHannel (PRACH) (S103) and receive a response message to the random access on a PDCCH and a PDSCH associated with the PDCCH (S104). In case of contention-based random access except for handover, the UE may perform a contention resolution procedure by transmitting an additional PRACH (S105) and receiving a PDCCH and a PDSCH associated with the PDCCH (S106).

After the above procedure, the UE may receive a PDCCH and/or a PDSCH from the BS (S107) and transmit a Physical Uplink Shared CHannel (PUSCH) and/or a Physical Uplink Control CHannel (PUCCH) to the BS (S108), which is a general downlink and uplink signal transmission procedure.

FIG. 2 illustrates an operation for processing an uplink signal for transmission at a UE.

Referring to FIG. 2, in the UE, a scrambler 201 may scramble a transmission signal with a UE-specific scrambling signal. A modulation mapper 202 modulates the scrambled signal received from the scrambler 201 to complex symbols in Binary Phase Shift Keying (BPSK), Quadrature Phase Shift Keying (QPSK), or 16-ary Quadrature Amplitude Modulation (16QAM) according to the type and/or channel state of the transmission signal. A transform precoder 203 processes the complex symbols received from the modulation mapper 202. A resource element mapper 204 may map the complex symbols received from the transform precoder 203 to time-frequency resource elements for actual transmission. After being processed in a Single Carrier Frequency Division Multiple Access (SC-FDMA) signal generator 205, the mapped signal may be transmitted to a BS through an antenna.

FIG. 3 illustrates an operation for processing a downlink signal for transmission at a BS.

In the 3GPP LTE system, a BS may transmit one or more codewords on a downlink. As is done on an uplink in the signal processing operation illustrated in FIG. 2, scramblers 301 and modulation mappers 302 may process one or more codewords to complex symbols. A layer mapper 303 may map the complex symbols to a plurality of layers and a precoder 304 may multiply the layers by a precoding matrix selected according to a channel state and may allocate the multiplied signals to respective antennas. Resource element mappers 305 map the antenna-specific signals received from the precoder 304 to time-frequency resource elements. After being processed in Orthogonal Frequency Division Multiple Access (OFDMA) signal generators 306, the mapped signals may be transmitted through the antennas.

In the mobile communication system, Peak-to-Average Power Ratio (PAPR) may become a big issue to uplink signal transmission from a UE, relative to downlink signal transmission from a BS. Accordingly, SC-FDMA is adopted for uplink signal transmission, while OFDMA is used for downlink signal transmission, as described before with reference to FIGS. 2 and 3.

FIG. 4 illustrates SC-FDMA used for uplink signal transmission and OFDMA used for downlink signal transmission in the mobile communication system.

Referring to FIG. 4, both a UE and a BS commonly have a Serial-to-Parallel Converter (SPC) 401, a subcarrier mapper 403, an M-point Inverse Discrete Fourier Transform (IDFT) module 404, and a Cyclic Prefix (CP) adder 406, for uplink transmission and downlink transmission.

Notably, the UE further includes a Parallel-to-Serial Converter (PSC) 405 and an N-point Discrete Fourier Transform (DFT) module 402 to transmit an uplink signal. The N-point DFT module 402 is characterized in that it partially compensates for the effects of IDFT performed by the M-point IDFT module 404 such that a transmission uplink signal assumes a single carrier property.

FIG. 5 illustrates signal mapping methods in the frequency domain to satisfy the single carrier property in the frequency domain. Specifically, FIG. 5(a) illustrates localized mapping and FIG. 5(b) illustrates distributed mapping. Only localized mapping is allowed in the current 3GPP LTE system.

Now a description will be given of a modification of SC-FDMA known as clustered SC-FDMA. In clustered SC-FDMA, DFT output samples are divided into sub-groups and sequentially mapped to subcarrier areas which are spaced from one another for the respective sub-groups at the input of Inverse Fast Fourier Transform (IFFT) samples, during sub-carrier mapping between a DFT process and an IFFT process. When needed, clustered SC-FDMA may involve filtering and cyclic extension.

The sub-groups may also be referred to as clusters and cyclic extension is to insert a guard interval longer than the maximum delay spread of a channel between successive symbols in order to prevent Inter-Symbol Interference (ISI) caused by multi-path propagation.

DISCLOSURE

Technical Problem

An object of the present invention devised to solve the problem lies on a method and apparatus for transmitting a signal using repetition coding in a wireless communication system.

It will be appreciated by persons skilled in the art that the objects that can be achieved with the present invention are not limited to what has been particularly described hereinabove and the above and other objects that the present invention can achieve will be more clearly understood from the following detailed description taken in conjunction with the accompanying drawings.

Technical Solution

The object of the present invention can be achieved by providing a method for transmitting information data using a repetition coding scheme in a wireless communication system, including generating a codeword of a predetermined size $N_{encoded}$ by encoding information data of a size $N_{info}$, and transmitting the codeword to a receiver. The codeword includes a plurality of repeated blocks based on the information data and if the information data includes an odd number of 1s, odd-numbered repeated blocks among the plurality of repeated blocks are bit-inverted data of the information data.

In another aspect of the present invention, provided herein is a transmission apparatus in a wireless communication system, including a processor for generating a codeword of a predetermined size $N_{encoded}$ by encoding information data of a size $N_{info}$, and a transmission module for transmitting the codeword to a receiver. The codeword includes a plurality of repeated blocks based on the information data and if the information data includes an odd number of 1s, odd-numbered repeated blocks among the plurality of repeated blocks are bit-inverted data of the information data.

If the information data size $N_{info}$ and the codeword size $N_{encoded}$ satisfy $2kN_{Info} < N_{encoded} < (2k+1)N_{Info}$ (k is an integer), a $(2k+1)^{th}$ repeated block may be created by bit-inverting the information data and puncturing $N_{encoded} - 2kN_{Info}$ bits of the bit-inverted information data.

If the information data size $N_{info}$ and the codeword size $N_{encoded}$ satisfy $(2k+1)N_{Info} < N_{encoded} < (2k+2)N_{Info}$ (k is an integer), a $(2k+2)^{th}$ repeated block may be created by puncturing $N_{encoded} - (2k+1)N_{Info}$ bits of the information data.

If the information data size $N_{info}$ and the codeword size $N_{encoded}$ satisfy $(2k+1)N_{Info} < N_{encoded} < (2k+2)N_{Info}$ (k is an integer), a $(2k+1)^{th}$ repeated block and a $(2k+2)^{th}$ repeated block may be non-bit-inverted data of the information data, and the $(2k+2)^{th}$ repeated block is created by puncturing $N_{encoded} - (2k+1)N_{Info}$ bits of the information data.

Advantageous Effects

In a wireless communication system, a transmitter can effectively encode a transmission signal through repetition coding according to the present invention, and a receiver can efficiently receive the signal from the transmitter.

It will be appreciated by persons skilled in the art that the effects that can be achieved with the present invention are not limited to what has been particularly described hereinabove and other advantages of the present invention will be more clearly understood from the following detailed description taken in conjunction with the accompanying drawings.

DESCRIPTION OF DRAWINGS

The accompanying drawings, which are included to provide a further understanding of the invention, illustrate embodiments of the invention and together with the description serve to explain the principle of the invention.

In the drawings:

FIG. 5 illustrates signal mapping methods in the frequency domain to satisfy a single carrier property in the frequency domain.

FIG. 15 illustrates ACKnowledgment/Negative ACKnowledgment (ACK/NACK) channelization for PUCCH Formats 1a and 1b.

MODE FOR INVENTION

The configuration, operation, and other features of the present invention will readily be understood with embodiments of the present invention described with reference to the attached drawings. Embodiments of the present invention as set forth herein are examples in which the technical features of the present invention are applied to a system using a plurality of orthogonal subcarriers. While the following description is given on the assumption that a $3^{rd}$ Generation Partnership Project (3GPP) system is being used, this is purely exemplary. Thus it is to be clearly understood that the present invention is applicable to a wide range of wireless communication systems including Institute of Electrical and Electronics Engineers (IEEE) 802.16 systems.

Specific terms used in the specification and the appended claims are provided to help the understanding of the present invention and can be replaced with other forms within the scope and spirit of the present invention.

Figure 1:
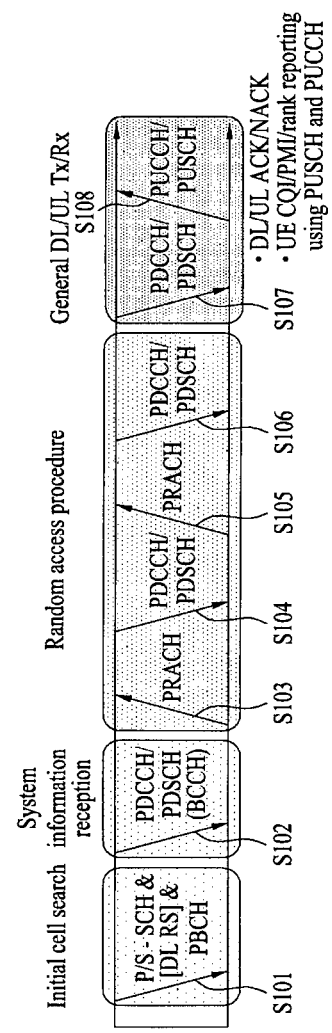
FIG. 1 illustrates physical channels and a method for transmitting signals on the physical channels in a mobile communication system, 3rd Generation Project Partnership Long Term Evolution (3GPP LTE)
Figure 2:
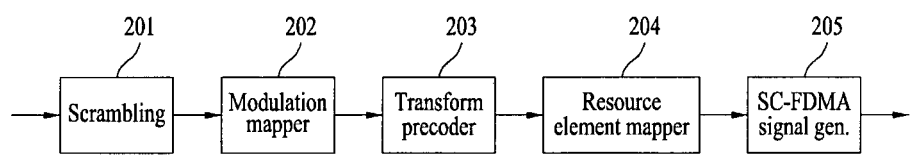
FIG. 2 illustrates an operation for processing an uplink signal for transmission at a User Equipment (UE).
Figure 3:
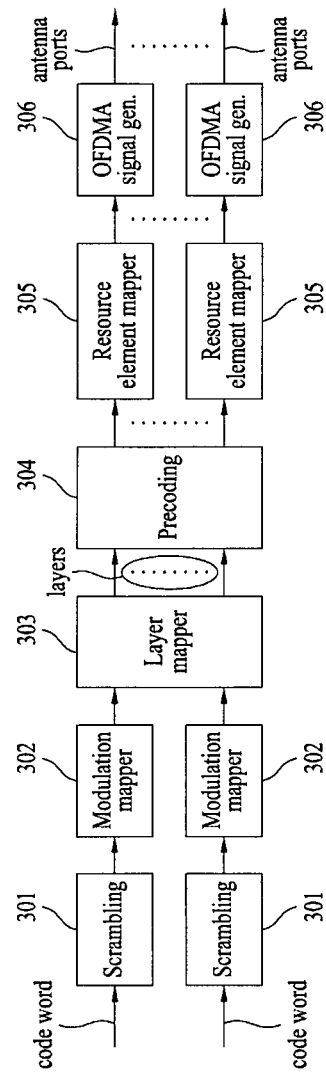
FIG. 3 illustrates an operation for processing a downlink signal for transmission at a Base Station (BS).
Figure 4:
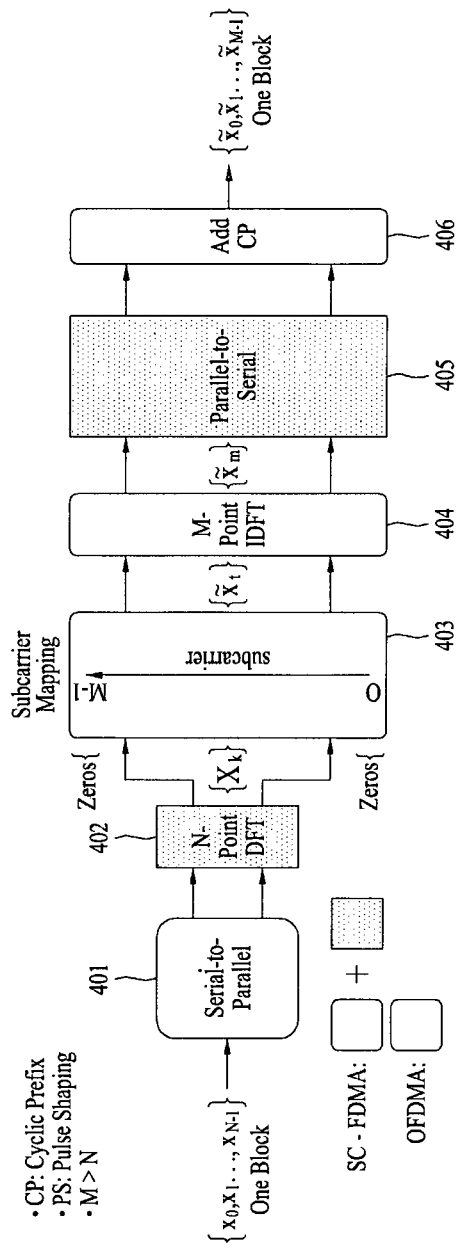
FIG. 4 illustrates Single Carrier Frequency Division Multiple Access (SC-FDMA) used for uplink signal transmission and Orthogonal Frequency Division Multiple Access (OFDMA) used for downlink signal transmission in the mobile communication system.
Figure 6:
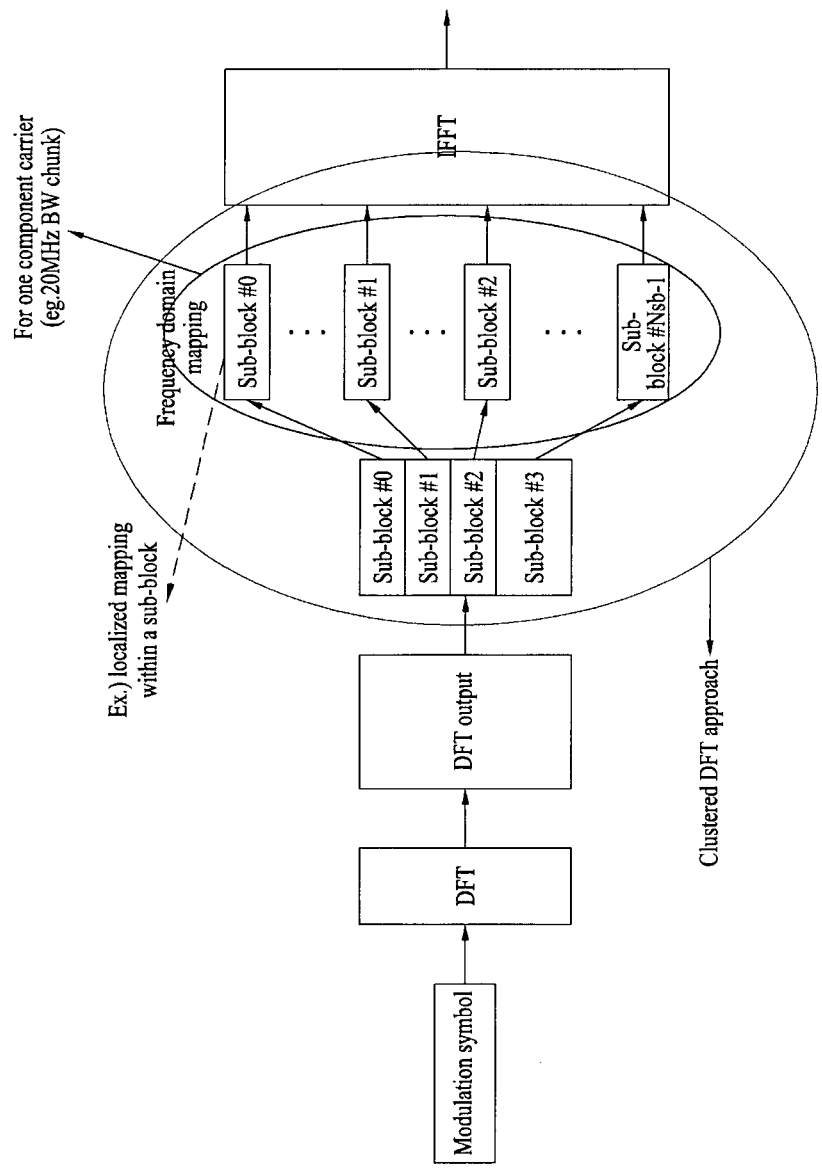
FIG. 6 illustrates an operation for mapping Discrete Fourier Transform (DFT) output samples to a single carrier in clustered SC-FDMA according to an embodiment of the present invention.
Figure 7:
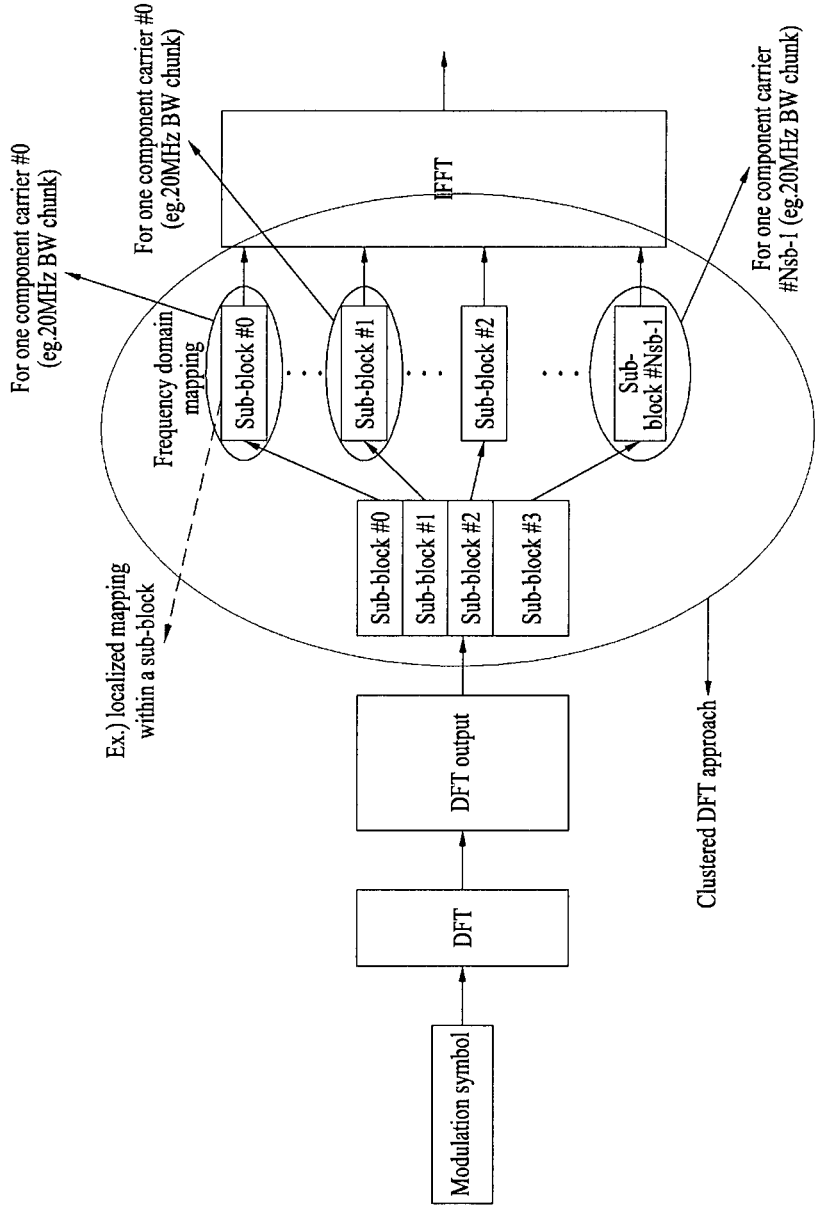
FIGS. 7 and 8 illustrate operations for mapping DFT output samples to a plurality of carriers in clustered SC-FDMA according to embodiments of the present invention.
Figure 8:
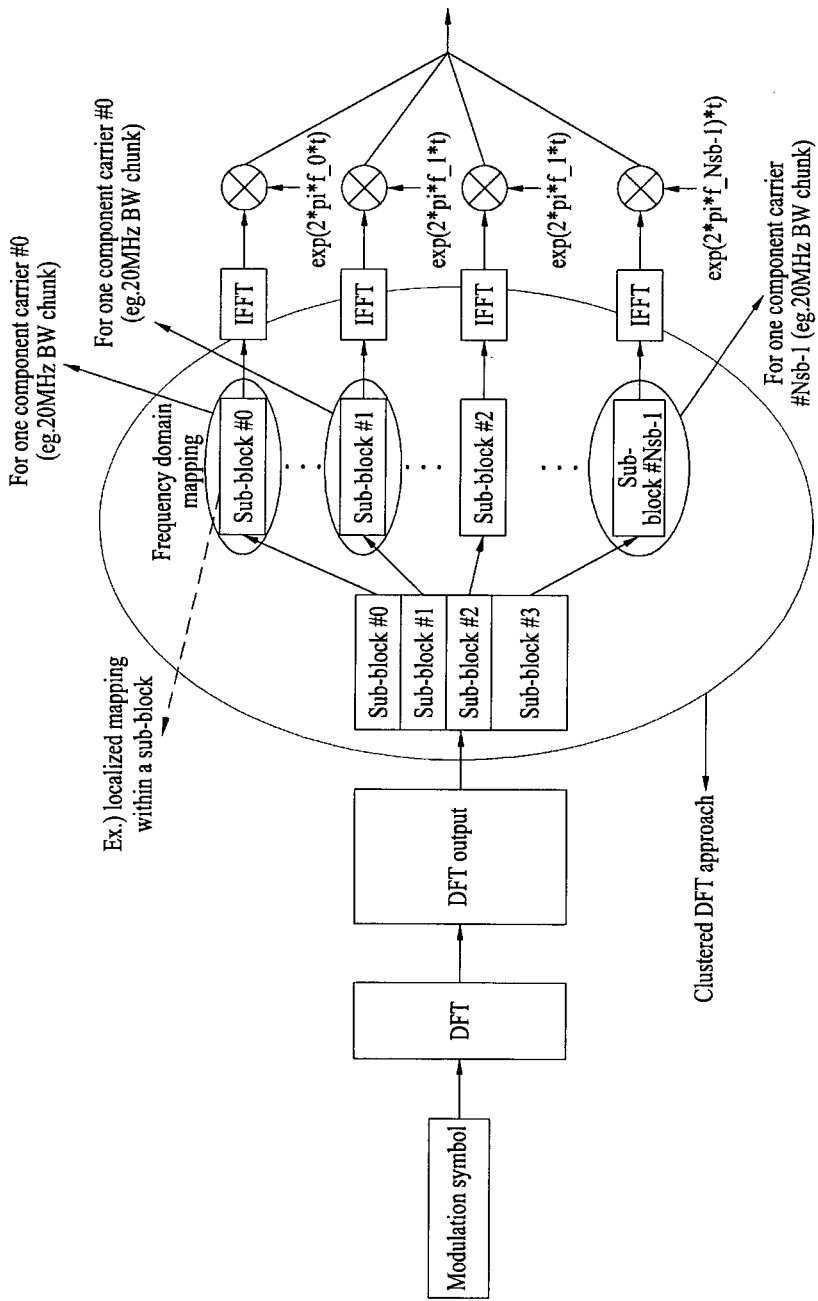

FIG. 6 illustrates an operation for mapping Discrete Fourier Transform (DFT) output samples to a single carrier in clustered Single Carrier Frequency Division Multiple Access (SC-FDMA) according to an embodiment of the present invention. FIGS. 7 and 8 illustrate operations for mapping DFT output samples to a plurality of carriers in clustered SC-FDMA according to embodiments of the present invention.

FIG. 6 depicts intra-carrier implementation of cluster SC-FDMA, whereas FIGS. 7 and 8 depict inter-carrier implementation of cluster SC-FDMA. More specifically, with contiguous component carriers whose subcarriers are aligned with a subcarrier spacing, allocated in the frequency domain, a signal is generated in a single IFFT block in the illustrated case of FIG. 7. With non-contiguous component carriers allocated in the frequency domain, a signal is generated in a plurality of IFFT blocks because the component carriers are not successive in the illustrated case of FIG. 8.

Segmented SC-FDMA is a simple extension of the DFT spreading and IFFT subcarrier mapping structure of the conventional SC-FDMA, when the number of DFT blocks is equal to the number of IFFT blocks and thus the DFT blocks and the IFFT blocks are in a one-to-one correspondence. While the term 'segmented SC-FDMA' is adopted herein, it may also be called NxSC-FDMA or NxDFT spread OFDMA (NxDFT-s-OFDMA).

Figure 9:
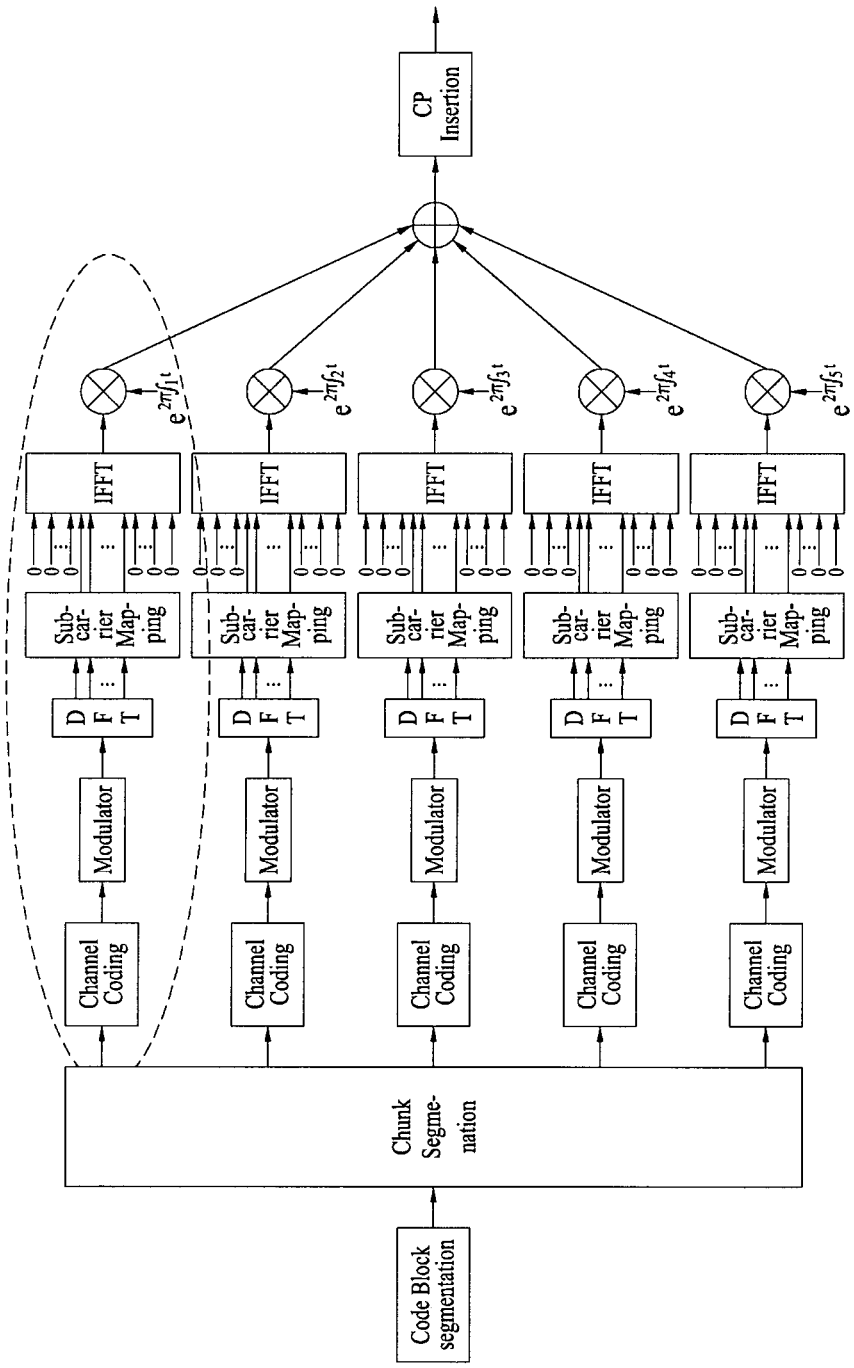
FIG. 9 illustrates a signal processing operation in a segmented SC-FDMA system according to an embodiment of the present invention.

FIG. 9 illustrates a signal processing operation in a segmented SC-FDMA system according to an embodiment of the present invention.

Referring to FIG. 9, segmented SC-FDMA is characterized in that total time-domain modulation symbols are divided into N groups (N is an integer larger than 1) and a DFT process is performed on a group-by-group basis to relieve the single carrier property constraint.

Figure 10:
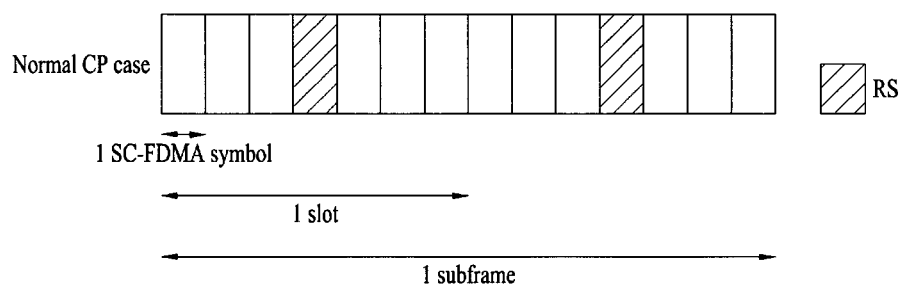
FIG. 10 illustrates a subframe structure for transmitting Reference Signals (RSs) in case of a normal Cyclic Prefix (CP).
Figure 11:
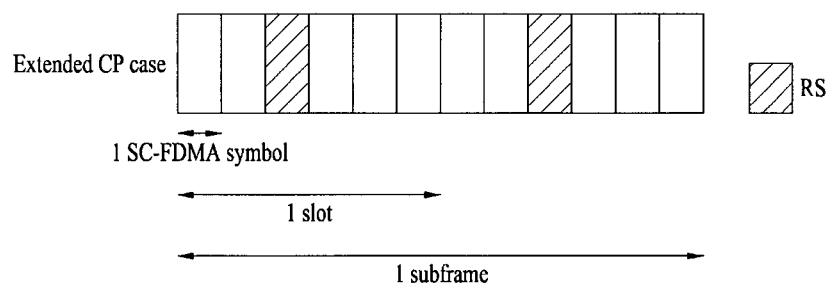
FIG. 11 illustrates a subframe structure for transmitting RSs in case of an extended CP.

FIG. 10 illustrates a subframe structure for transmitting Reference Signals (RSs) in case of a normal Cyclic Prefix (CP) and FIG. 11 illustrates a subframe structure for transmitting RSs in case of an extended CP. RSs are transmitted in $4^{th}$ and $11^{th}$ Orthogonal Frequency Division Multiplexing (OFDM) symbols in FIG. 10, whereas RSs are transmitted in $3^{rd}$ and $9^{th}$ OFDM symbols in FIG. 11.

The following formats are available for the PUCCH to carry control information.

(1) PUCCH Format 1: Scheduling Request (SR) only with On-Off Keying (OOK).

(2) PUCCH Formats 1a and 1b: ACK/NACK only.
   1) PUCCH Format 1a: BPSK ACK/NACK for 1 codeword
   2) PUCCH Format 1b: QPSK ACK/NACK for 2 codewords (3) PUCCH Format 2: Channel Quality Indicator (CQI) only with QPSK.

(4) PUCCH Formats 2a and Format 2b: CQI and ACK/NACK.

Table 1 lists modulation schemes and the numbers of bits per subframe for different PUCCH formats, Table 2 lists the numbers of demodulation reference symbols (DM-RS) per slot for the PUCCH formats, and Table 3 lists the locations of DM-RSs for the PUCCH formats. In Table 1, the modulation schemes and the numbers of bits per subframe are specified for PUCCH Formats 2a and 2b in case of a normal CP.

TABLE 1

| PUCCH format | Modulation scheme | Number of bits per subframe $M_{bit}$ |
|---|---|---|
| 1 | N/A | N/A |
| 1a | BPSK | 1 |
| 1b | QPSK | 2 |
| 2 | QPSK | 20 |
| 2a | QPSK + BPSK | 21 |
| 2b | QPSK + BPSK | 22 |

TABLE 2

| PUCCH format | Normal CP | Extended CP |
|---|---|---|
| 1, 1a, 1b | 3 | 2 |
| 2 | 2 | 1 |
| 2a, 2b | 2 | N/A |

TABLE 3

| | Set of values for 1 | |
|---|---|---|
| PUCCH format | Normal CP | Extended CP |
| 1, 1a, 1b | 2, 3, 4 | 2, 3 |
| 2, 2a, 2b | 1, 5 | 3 |

ACK/NACK signals of UEs are transmitted in different resources of Computer-Generated Constant Amplitude Zero Auto Correlation (CG-CAZAC) sequences with different cyclic shift values (frequency-domain codes) and Walsh/DFT orthogonal codes (time-domain spread codes). If 6 cyclic shift values and 3 Walsh/DFT codes are available, a total of 18 UEs may be multiplexed in the same Physical Resource Block (PRB).

Figure 12:
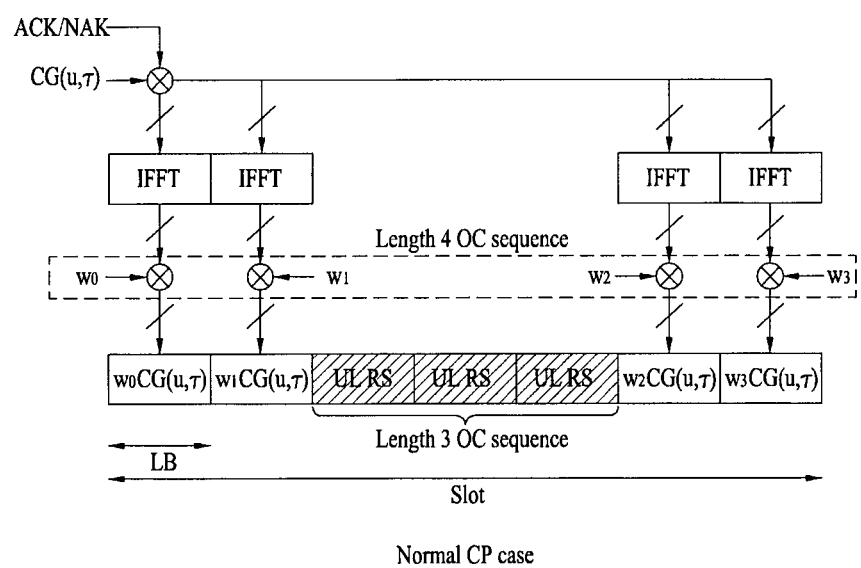
FIG. 12 illustrates Physical Uplink Control CHannel (PUCCH) Formats 1a and 1b in case of a normal CP.
Figure 13:
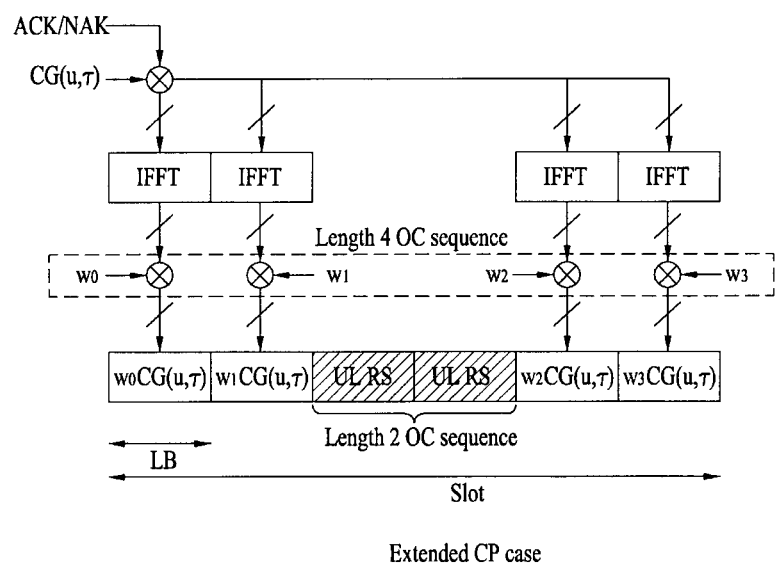
FIG. 13 illustrates PUCCH Formats 1a and 1b in case of an extended CP.

FIG. 12 illustrates a method for applying PUCCH Formats 1a and 1b in case of a normal CP and FIG. 13 illustrates a method for applying PUCCH Formats 1a and 1b in case of an extended CP. w0, w1, w2 and 3 may be modulated in the time domain after FFT or in the frequency domain before FFT.

Figure 14:
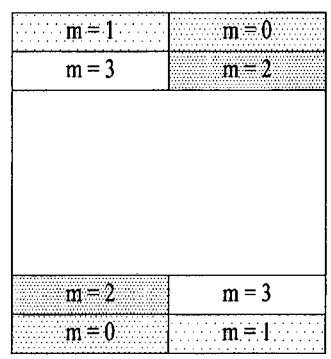
FIG. 14 illustrates a PUCCH structure at a subframe level.

FIG. 14 illustrates a PUCCH structure at a subframe level. A PUCCH may be transmitted at a frequency-mirrored position in the second slot of a subframe with respect to a transmission position in the first slot of the subframe. For an SR and persistent scheduling, ACK/NACK resources including a cyclic shift, a Walsh/DFT code, and a PRB, which are allocated to a UE, may be indicated to the UE by Radio Resource Control (RRC) signaling. Resources allocated for a dynamic ACK/NACK and non-persistent scheduling may be indicated implicitly to a UE by the index of the lowest Control Channel Element (CCE) of a PDCCH corresponding to a PDSCH for the ACK/NACK. Length-4 and length-3 orthogonal sequences for PUCCH Format 1/1a/1b are illustrated in Table 4 and table 5 below.

TABLE 4

Length-4 orthogonal sequences for PUCCH formats 1/1a/1b

| Sequence index $n_{oc}(n_s)$ | Orthogonal sequences $[w(0) \ldots w(N_{SF}^{PUCCH} - 1)]$ |
| --- | --- |
| 0 | [+1 +1 +1 +1] |
| 1 | [+1 −1 +1 −1] |
| 2 | [+1 −1 −1 +1] |

TABLE 5

Length-3 orthogonal sequences for PUCCH formats 1/1a/1b

| Sequence index $n_{oc}(n_s)$ | Orthogonal sequences $[w(0) \ldots w(N_{SF}^{PUCCH} - 1)]$ |
| --- | --- |
| 0 | [1 1 1] |
| 1 | [1 $e^{j2\pi/3}$ $e^{j4\pi/3}$] |
| 2 | [1 $e^{j4\pi/3}$ $e^{j2\pi/3}$] |

Table 6 lists orthogonal sequences for RSs in PUCCH Format 1/1a/1b.

TABLE 6

| | 1a and 1b | |
| --- | --- | --- |
| Sequence index $\bar{n}_{oc}(n_s)$ | Normal cyclic prefix | Extended cyclic prefix |
| 0 | [1 1 1] | [1 1] |
| 1 | [1 $e^{j2\pi/3}$ $e^{j4\pi/3}$] | [1 −1] |
| 2 | [1 $e^{j4\pi/3}$ $e^{j2\pi/3}$] | N/A |

FIG. 15 illustrates ACK/NACK channelization for PUCCH Formats 1a and 1b. In the illustrated case of FIG. 15, $\Delta_{shift}^{PUCCH}=2$.

Figure 16:
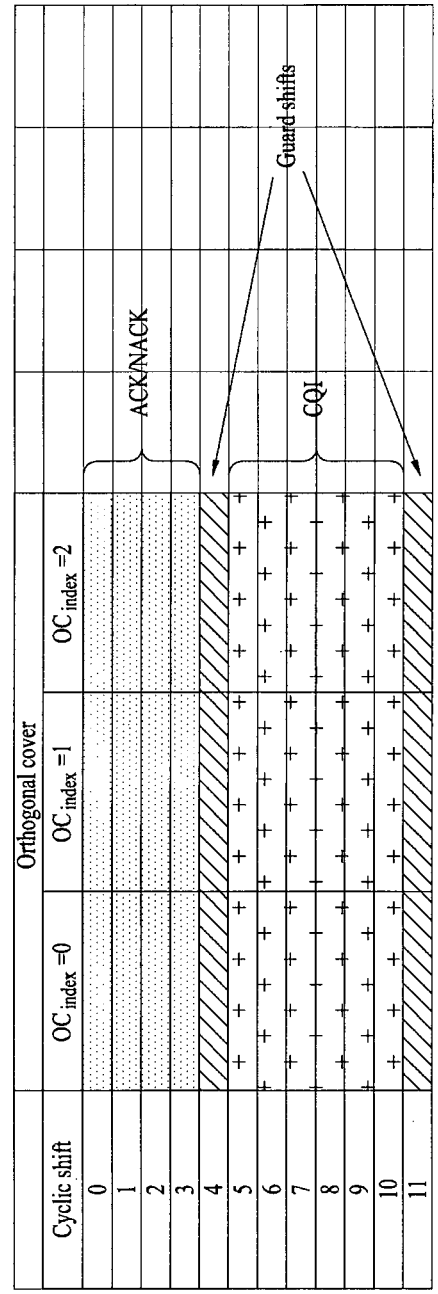
FIG. 16 illustrates channelization for a mixed structure of PUCCH Format 1/1a/1b and PUCCH Format 2/2a/2b in the same Physical Resource Block (PRB).

FIG. 16 illustrates channelization for a mixed structure of PUCCH Format 1/1a/1b and PUCCH Format 2/2a/2b in the same PRB.

Cyclic Shift (CS) hopping and Orthogonal Cover (OC) remapping may be applied as follows.

(1) Cell-specific CS hopping on a symbol basis for inter-cell interference randomization.

(2) Slot-level CS/OC re-mapping:
  1) For inter-cell interference randomization; and
  2) Slot-based approach for mapping between ACK/NACK channels and resources k.

Resources ($n_r$) for PUCCH Format 1/1a/1b include the following three types of resources.

(1) CS (=DFT orthogonal code at a symbol level)→$n_{cs}$
(2) OC (orthogonal covering at a slot level)→$n_{oc}$
(3) Frequency RB→$n_{rb}$ That is, a representative index nr includes ncs, noc and nrb. That is, the representative index nr satisfies $n_r=(n_{cs},n_{oc}, n_{rb})$.

Control information of a CQI, a Precoding Matrix Index (PMI), and a Rank Indication (RI) and control information of a CQI and an ACK/NACK in combination may be delivered in PUCCH Format 2/2a/2b. Reed Muller (RM) channel coding may be applied to PUCCH Format 2/2a/2b.

For example, channel coding for an Uplink Control Information (UCI) CQI in the 3GPP LTE system is described as follows. A CQI bit stream input to a channel coding block is denoted by $a_0, a_1, a_2, a_3, \ldots, a_{A-1}$ and encoded using a (20, A) RM code. Table 7 below defines basis sequences for the (20, A) RM code.

TABLE 7

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
| --- | --- | --- | --- | --- | --- | --- | --- | --- | --- | --- | --- | --- | --- |
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Channel coded bits $b_0, b_1, b_2, b_3, \ldots, b_{B-1}$ may be generated by the following equation.

$$b_i = \sum_{n=0}^{A-1} (a_n \cdot M_{i,n}) \bmod 2 \quad \text{[Equation 1]}$$

where $i = 0, 1, 2, \ldots, B-1$.

Table 8 below illustrates a UCI field for CQI feedback for wideband reports (for PDSCH transmissions over a single antenna port, with transmit diversity, or with open loop spatial multiplexing).

TABLE 8

| Field | Bitwidths |
|---|---|
| Wideband CQI | 4 |

Table 9 illustrates UCI fields for CQI and PMI feedback for wideband reports. These fields report about PDSCH transmissions with closed loop spatial multiplexing.

TABLE 9

| | Bitwidths | | | |
|---|---|---|---|---|
| | 2 antenna ports | | 4 antenna ports | |
| Field | Rank = 1 | Rank = 2 | Rank = 1 | Rank > 1 |
| Wideband CQI | 4 | 4 | 4 | 4 |
| Spatial differential CQI | 0 | 3 | 0 | 3 |
| PMI (Precoding Matrix Index) | 2 | 1 | 4 | 4 |

Table 10 illustrates a UCI field for RI feedback for wideband reports.

TABLE 10

| | Bitwidths | | |
|---|---|---|---|
| | | 4 antenna ports | |
| Field | 2 antenna ports | Max 2 layers | Max 4 layers |
| RI (Rank Indication) | 1 | 1 | 2 |

Herein, $a_0$ corresponds to the Most Significant Bit (MSB) and $a_{A-1}$ corresponds to the Least Significant Bit (LSB). In case of an extended CP, the maximum number of information bits is 11, except the case where a CQI and an ACK/NACK are transmitted simultaneously. After 20 bits are encoded using an RM code, the coded bits may be modulated in QPSK. Before the QPSK modulation, the coded bits may be scrambled.

Figure 17:
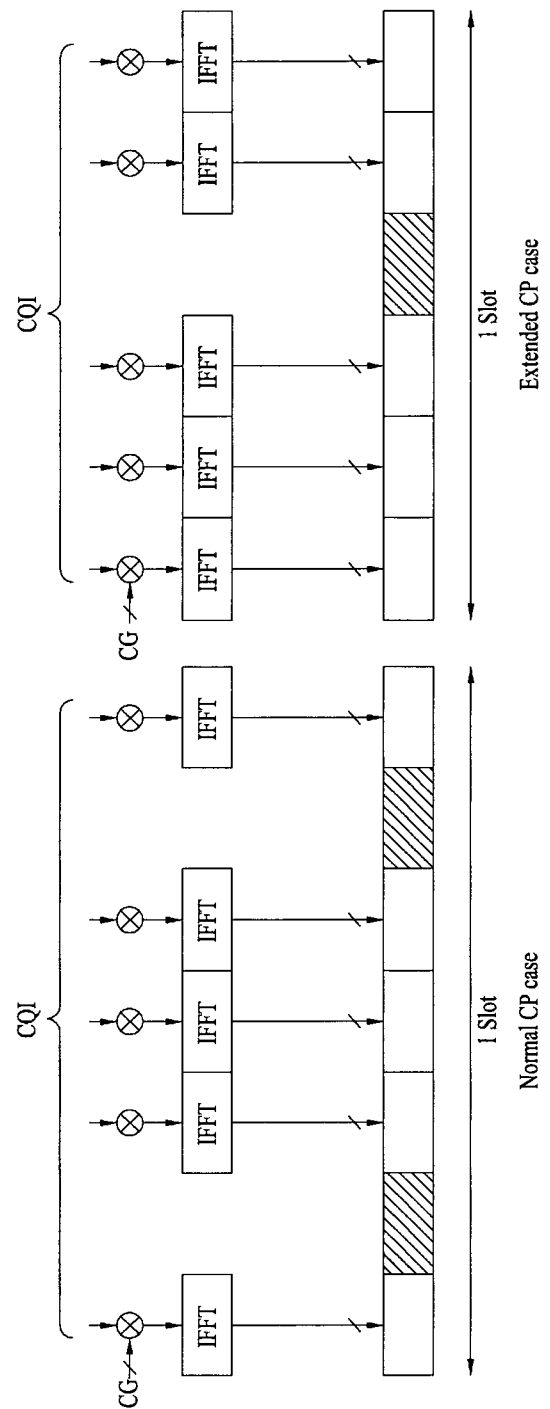
FIG. 17 illustrates a slot-level structure for PUCCH Format 2/2a/2b.

FIG. 17 illustrates a slot-level structure for PUCCH Format 2/2a/2b.

Referring to FIG. 17, one subframe with a normal CP includes 10 QPSK data symbols in addition to RS symbols. That is, each QPSK symbol is spread with a CS using 20 coded CQI bits at an SC-FDMA symbol level.

SC-FDMA symbol-level CS hopping may be carried out to randomize inter-cell interference. RSs may be multiplexed in Code Division Multiplexing (CDM) through CS. For example, 12/6 UEs may be multiplexed in the same PRB using 12/6 available CSs. Thus, some UEs may be multiplexed by CS+OC+PRB and CS+PRB in PUCCH Formats 1/1a/1b and 2/2a/2b.

Figure 18:
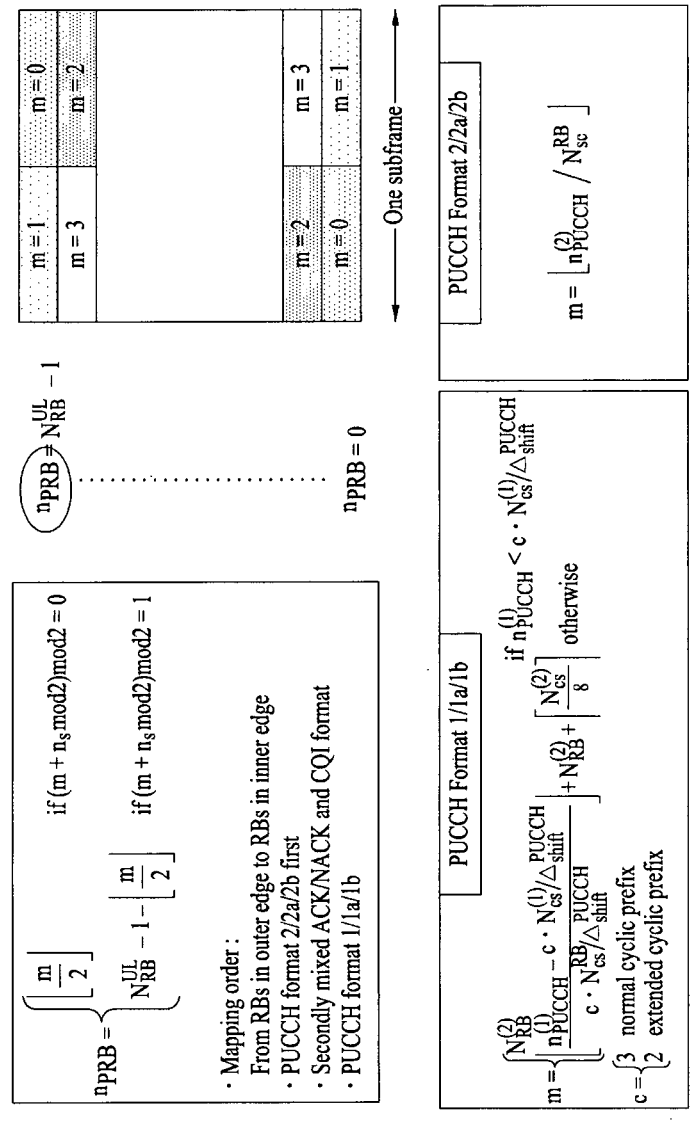
FIG. 18 illustrates PRB allocation.

FIG. 18 illustrates a PRB allocation method.

Referring to FIG. 18, a PRB may be used to carry a PUCCH in slot $n_s$.

According to the present invention, DL CC#n represents a downlink component carrier #n and UL CC#n represents an uplink component carrier #n.

Now a description will be given of a method for managing PHYsical (PHY) layers that control a plurality of carriers using one higher layer (e.g. a Medium Access Control (MAC) layer, an RRC layer, and a Packet Data Convergence Protocol (PDCP) layer) to efficiently use the plurality of carriers.

Figure 19:
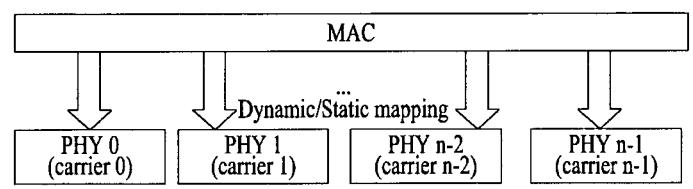
FIG. 19 is a conceptual view illustrating multi-carrier management of one Medium Access Control (MAC) layer from the perspective of transmission from a BS.
Figure 20:
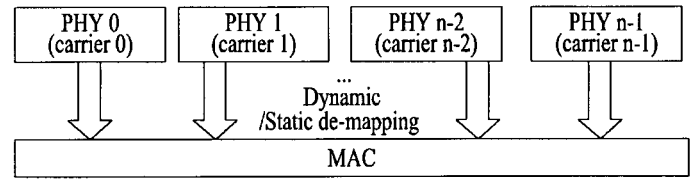
FIG. 20 is a conceptual view illustrating multi-carrier management of one MAC layer from the perspective of reception at a UE.

FIG. 19 is a conceptual view illustrating multi-carrier management of one MAC layer from the perspective of transmission from a BS and FIG. 20 is a conceptual view illustrating multi-carrier management of one MAC layer from the perspective of reception at a UE. For effective multi-carrier transmission and reception, both a transmitter and a receiver should be able to transmit and receive multiple carriers.

In this scheme, one MAC layer manages and transmits or receives one or more frequency carriers. Because the frequency carriers do not need to be contiguous, this multi-carrier management scheme is more flexible in terms of resource management. In FIGS. 19 and 20, one PHY layer refers to one CC, for the convenience' sake. Yet, a PHY layer is not necessarily an independent Radio Frequency (RF) device. While one independent RF device generally corresponds to one PHY layer, it may include a plurality of PHY layers.

Figure 21:
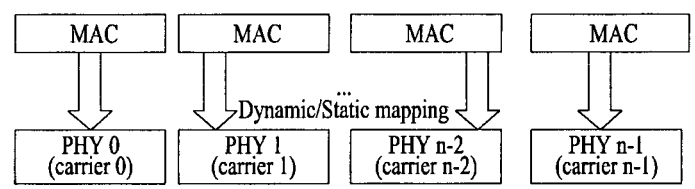
FIG. 21 is a conceptual view illustrating multi-carrier management of one or more MAC layers from the perspective of transmission from a BS.
Figure 22:
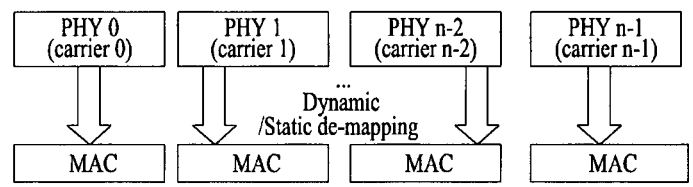
FIG. 22 is a conceptual view illustrating multi-carrier management of one or more MAC layers from the perspective of reception at a UE.
Figure 23:
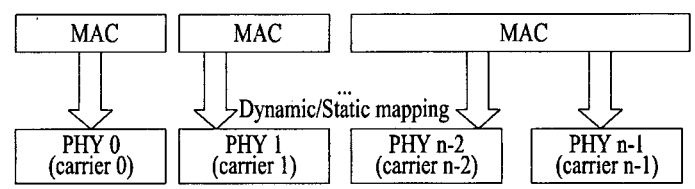
FIG. 23 is another conceptual view illustrating multi-carrier management of one or more MAC layers from the perspective of transmission from a BS.
Figure 24:
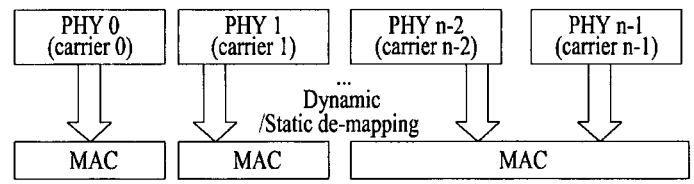
FIG. 24 is another conceptual view illustrating multi-carrier management of one or more MAC layers from the perspective of reception at a UE.

FIG. 21 is a conceptual view illustrating multi-carrier management of one or more MAC layers from the perspective of transmission from a BS, FIG. 22 is a conceptual view illustrating multi-carrier management of one or more MAC layers from the perspective of reception at a UE, FIG. 23 is another conceptual view illustrating multi-carrier management of one or more MAC layers from the perspective of transmission from a BS, and FIG. 24 is another conceptual view illustrating multi-carrier management of one or more MAC layers from the perspective of reception at a UE.

Apart from the structures illustrated in FIGS. 19 and 20, a plurality of MAC layers may control a plurality of carriers, as illustrated in FIGS. 21 to 24.

The above-described system uses a plurality of, that is, N carriers and the carriers may be contiguous or non-contiguous irrespective of downlink or uplink. A Time Division Duplex (TDD) system is configured to use N carriers such that downlink transmission and uplink transmission are distinguished by time on each carrier, whereas a Frequency Division Duplex (FDD) system is configured to use a plurality of carriers for each of downlink transmission and uplink transmission.

Although a downlink bandwidth and an uplink bandwidth may be set to be different, a legacy system basically supports transmission and reception on a single carrier. However, a system of the present invention can use a plurality of carriers by carrier aggregation. In addition, an FDD system may support asymmetrical carrier aggregation which means that the number of aggregated carriers and/or a carrier bandwidth is different for the downlink and the uplink.

Carrier aggregation where two or more CCs are aggregated may be supported for wider transmission bandwidths, for example, up to 100 MHz and for spectrum aggregation.

A UE may simultaneously transmit or receive one or more CCs depending on its capabilities.

A UE with reception and/or transmission capabilities for carrier aggregation can simultaneously receive and/or transmit on multiple CCs.

It is possible to configure all CCs to be compatible with a legacy system, when the numbers of aggregated CCs are same for the downlink and the uplink. However, non-backward compatible configurations of CCs are not precluded in the present invention. It is possible to configure a UE to aggregate different numbers of CCs of different bandwidths for the downlink and the uplink. In typical TDD deployments, the number of CCs and the bandwidth of each CC are same for the downlink and the uplink.

In relation to a MAC-PHY interface, from a UE perspective, there is one HARQ entity per scheduled CC, in the absence of spatial multiplexing. Each transport block is mapped to a single CC only. A UE may be scheduled over multiple CCs simultaneously.

Figure 25:
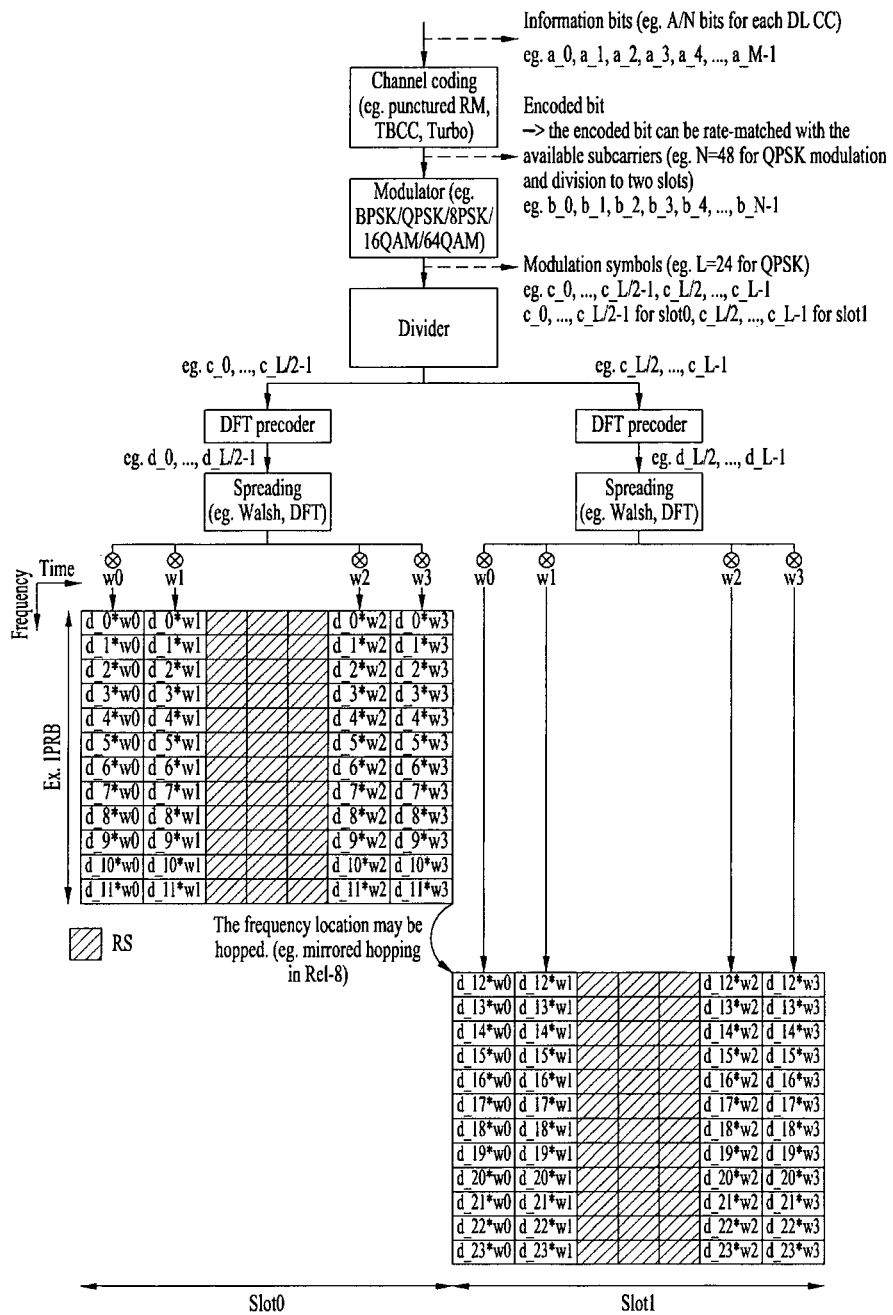
FIGS. 25 and 26 illustrate exemplary new PUCCH formats without Frequency Division Multiplexing (FDM) and with FDM, respectively.
Figure 26:
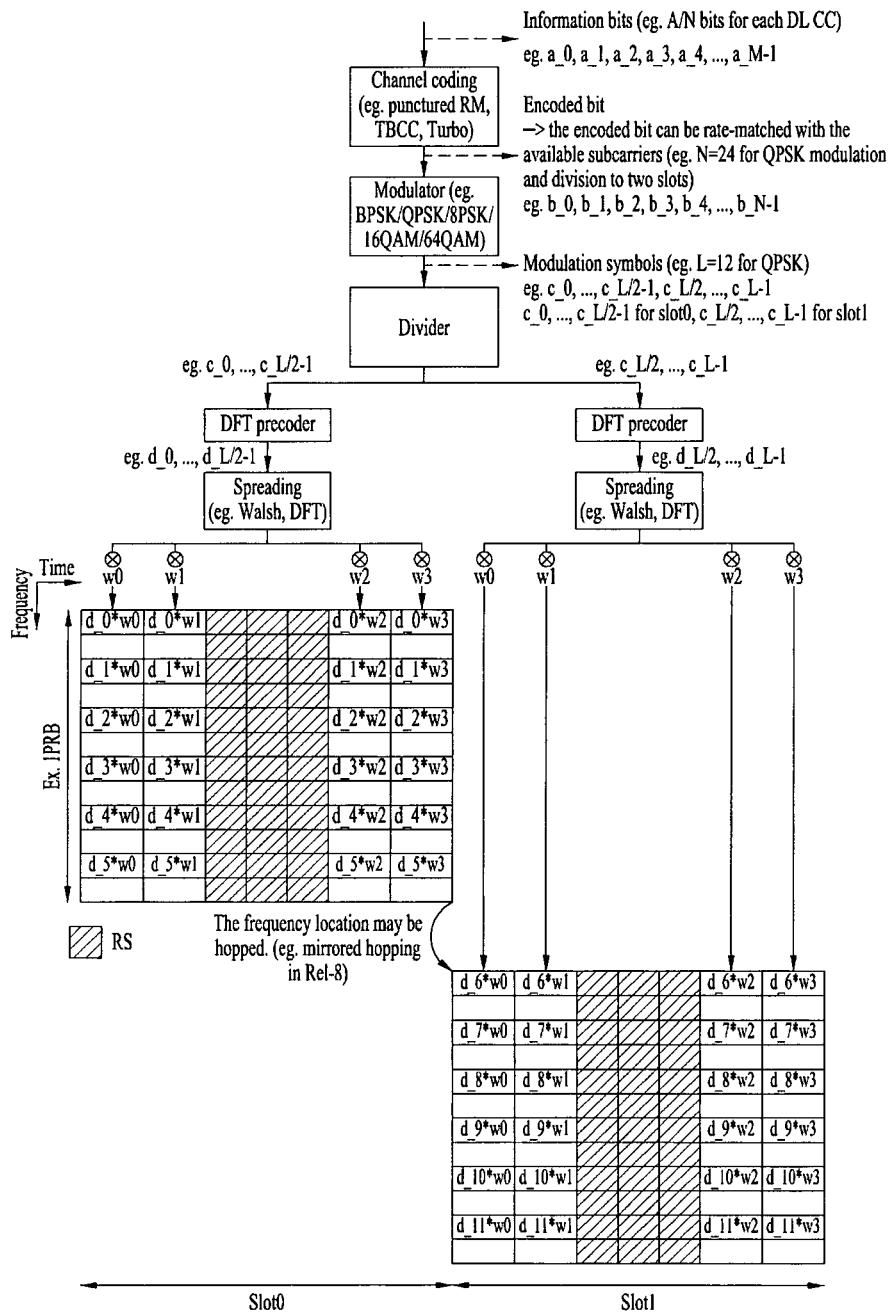

FIGS. 25 and 26 illustrate exemplary new PUCCH formats without Frequency Division Multiplexing (FDM) and with FDM, respectively.

For QPSK modulation, 48 coded bits and 24 coded bits are needed in the cases of FIGS. 25 and 26, respectively, irrespective of the number of information bits.

Repetition coding is to repeat given information data to match the size of the information data to a system-required data size. Despite the disadvantage of its decreased performance relative to a general channel coding scheme (e.g. turbo coding), the repetition coding scheme is widely used in communication systems requiring small data sizes due to coding and decoding simplicity and implementation easiness.

Figure 27:
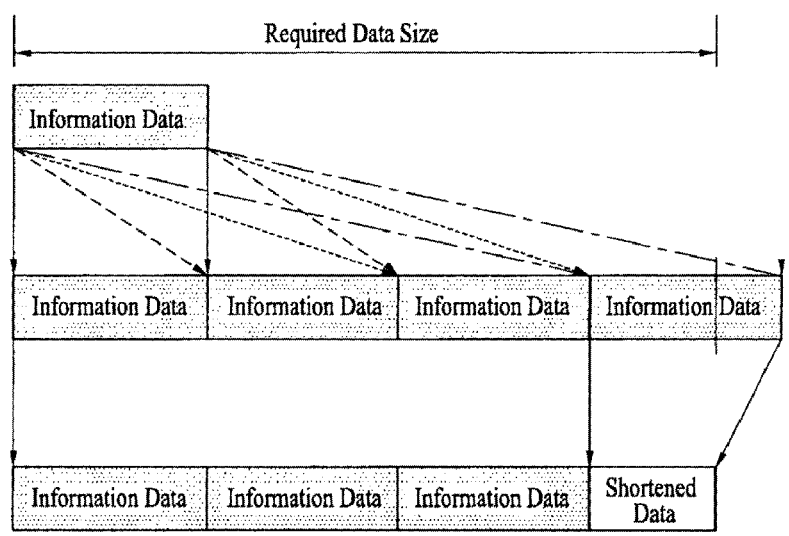
FIG. 27 illustrates a conventional repetition coding scheme.

FIG. 27 illustrates a conventional repetition coding scheme.

Referring to FIG. 27, if a system-required coded data size is not a multiple of the size of information data, the last repeated data block of coded data is created by shortening the information data. The information data may be shorted by discarding the start or end part of the given information data or selectively discarding some non-contiguous bits of the information data.

However, the conventional repetition coding scheme faces the problem of a very short distance between codewords. The distance between codewords is defined as the number of bits having different values at the same positions in the codewords. To be more specific, let the size of information data be denoted by $N_{Info}$ and the size of coded data be denoted by $N_{encoded}$. Then, a minimum distance $d_{min}$ between coded data produced according to the conventional repetition coding scheme is determined by $$d_{min} = \left\lfloor \frac{N_{encoded}}{N_{Info}} \right\rfloor \quad \text{[Equation 2]}$$

Because the minimum distance between codewords, $d_{min}$ is very small, the repetition coding scheme is much outperformed by other channel coding schemes.

In this context, the present invention provides a new repetition coding scheme having improved performance in combination with a modulation scheme. Compared to the conventional repetition coding scheme, the repetition coding scheme of the present invention has the same decoding complexity but an increased minimum distance between codewords. Therefore, the repetition coding scheme of the present invention can guarantee better performance when it is applied to systems.

Figure 28:
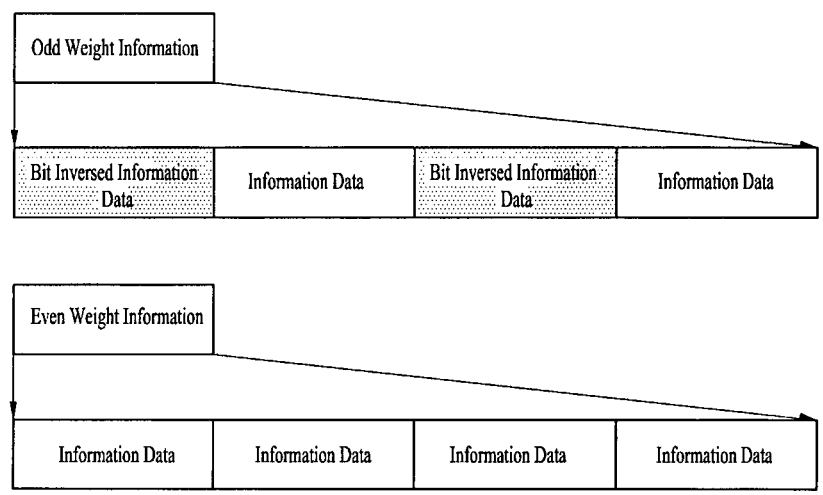
FIG. 28 illustrates a repetition coding scheme according to an embodiment of the present invention.

FIG. 28 illustrates a repetition coding scheme according to an embodiment of the present invention.

Referring to FIG. 28, a transmitter determines the weight of given information data, that is, counts the number of 1s in the information data. If the information data includes an odd number of 1s, the data of odd-numbered repeated blocks are bit-inverted. Bit inversion may be carried out through an XOR operation or modulo operation. For instance, a bit $b_0$ may be inversed by an XOR operation, $b_0 \oplus 1$ or a modulo operation, $(B_0+1) \bmod 2$. The above procedure is repeated until a system-required data size is matched.

For example, if the number of information bits is 4 ($N_{Info}=4$), information data is given as $d_0=1100$ and $d_1=1110$, and a system-required data size is 8 ($N_{encoded}=8$), the information data $d_0$ and $d_1$ are encoded to codewords $c'_0=11001100$ and $c'_1=11101110$ with a distance of 2 according to the conventional repetition coding scheme.

In comparison, the information data $d_0$ and $d_1$ are encoded to codewords $c_0=11001100$ and $c_1=00011110$ with a distance of 4 according to the repetition coding scheme of the present invention. Thus the same decoding complexity is maintained but the minimum distance between codewords is increased during channel coding.

In implementation of the repetition coding scheme of the present invention, it is also possible to bit-inverse a part of repeated blocks, when information data has an even number of 1s. The bit-inverted repeated blocks may be even-numbered repeated blocks.

After repetition coding according to the present invention, blockwise interleaving or bitwise interleaving may be performed. The blockwise interleaving permutes the sequence of repeated blocks, whereas the bitwise interleaving permutes the sequence of bits in a codeword.

In accordance with the repetition coding scheme of the present invention, the minimum distance between codewords, $d_{min}$ is computed by [Equation 3]. Therefore, the distance between codewords is always larger than $d_{min}$.

$$d_{min} = \min\left(2 \times \left\lfloor \frac{N_{encoded}}{N_{Info}} \right\rfloor, \right.$$
$$\left. N_{Info} \times \left\lfloor \frac{N_{encoded}}{2N_{Info}} \right\rfloor + \left\lfloor \frac{\bmod(N_{encoded}, 2N_{Info})}{N_{Info}} \right\rfloor \right) \quad \text{[Equation 3]}$$

In Tail-Biting Convolutional Coding (TBCC) or turbo coding, if the size of given information is smaller than a preset constraint length-1, normal coding is impossible. The repetition coding scheme of the present invention can be a solution to this problem. Especially, the repetition coding scheme of the present invention may be used along with convolution coding, TBCC, or turbo coding, as a pre-channel coding scheme.

Since convolutional coding, TBCC, and turbo coding are generally applicable for information data as long as or longer than a preset constraint length, the present invention may be a solution that matches information data shorter than the preset constraint length to an information bit size required for such a given channel coding scheme by applying the coding scheme for pre-channel coding.

The following description will be given, taking TBCC for an example.

TBCC is typically applicable to information data having (K−1) or more bits (K is a constraint length) because the first (K−1) bits of the information data are used as an initial value for a register during decoding. 3GPP Release-8 defines a constraint length of 7 for TBCC and thus only information data having six or more bits can be channel-coded in TBCC according to 3GPP Release-8. Accordingly, the present invention provides a method for channel-coding information data of a size $N_{Info}$ less than (K−1).

First of all, a reference value M that determines a coding scheme is set based on the size of given information data and a TBCC constraint length K applied to the system. The reference value M may be equal to the constraint length K or may be the least of integers larger than the constraint length K (e.g. M=K+1). In addition, the reference value M may be set to the largest of integers smaller than the constraint length K (e.g. M=K−1) or the largest of integers smaller than (K−1) (e.g. M=K−2). It is also possible to set the reference value M to a minimum bit size supported by the system. That is, the reference value M may be smaller or larger than the constraint length K depending on the environment of the system or system requirements.

If the size of information data is equal to or larger than the reference value M, TBCC may be used as done conventionally. On the other hand, if the size of information data is smaller than the reference value M, the repetition coding scheme of the present invention may be adopted. More specifically, if the information data has an odd number of 1s, odd-numbered blocks are bit-inverted among repeated blocks. Then resources are allocated according to received control information and the coded data is transmitted to a receiver. How to apply the repetition coding scheme of the present invention will be described, taking an example.

In a system that requires a coded data size of 24 ($N_{encoded}$=24) and uses TBCC with a constraint length of 7 (K=7), if $N_{Info}$=4, the reference value M may be usually set to 6. Since $N_{Info}$=4<M=6, the repetition coding scheme of the present invention should be adopted. The required coded data size $N_{encoded}$ is a multiple of $N_{Info}$=4 (2=4×6). Thus, if the information data is denoted by $a_0 a_1 a_2 a_3$ and has an odd number of 1s, the information data is encoded to a codeword $\overline{a_0 a_1 a_2 a_3} a_0 a_1 a_2 a_3 \overline{a_0 a_1 a_2 a_3} a_0 a_1 a_2 a_3 \overline{a_0 a_1 a_2 a_3} a_0 a_1 a_2 a_3$. If the information data has an even number of 1s, the codeword is $a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3$.

In another example, in a system that requires a coded data size of 48 ($N_{encoded}$=48) and uses TBCC with a constraint length of 7 (K=7), if $N_{Info}$=4, given data $a_0 a_1 a_2 a_3$ having an odd number of 1s is encoded to a codeword $\overline{a_0 a_1 a_2 a_3} a_0 a_1 a_2 a_3 \overline{a_0 a_1 a_2} a_3 a_0 a_1 a_2 a_3 \overline{a_0 a_1 a_2 a_3} a_0 a_1 a_2 a_3 \overline{a_0 a_1 a_2 a_3} a_0 a_1 a_2 a_3 \overline{a_0 a_1 a_2 a_3} a_0 a_1 a_2 a_3 \overline{a_0 a_1 a_2 a_3} a_0 a_1 a_2 a_3$. If the given data $a_0 a_1 a_2 a_3$ has an even number of 1s, the codeword is $a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3 a_0 a_1 a_2 a_3$.

As described above, the repetition coding scheme of the present invention may be implemented through bit inversion of some repeated blocks when information data has an even numbered of 1s, and the bit-inverted repeated blocks may be even-numbered repeated blocks.

After repetition coding according to the present invention, blockwise interleaving or bitwise interleaving may be performed. The blockwise interleaving permutes the sequence of repeated blocks, whereas the bitwise interleaving permutes the sequence of bits in a codeword.

Meanwhile, the last repeated block may be set as follows according to the relationship between the codeword length $N_{encoded}$ and the information data size $N_{Info}$.

If the codeword length $N_{encoded}$ and the information data size $N_{Info}$ satisfy $2kN_{Info} < N \leq (2k+1)N_{Info}$ (k is an integer), the last repeated block may be a bit stream created by puncturing information data according to $N_{encoded}$. Or the last repeated block may be a bit stream created by partially bit-inverting information data and puncturing the partially bit-inverted information data according to $N_{encoded}$. That is, $N_{encoded}$−$2kN_{Info}$ bits of the information data are punctured for the last repeated block, to match $N_{encoded}$. Puncturing is the process of deleting as many bits as needed from the start or end of the information bit stream or from arbitrary contiguous or non-contiguous positions of the information bit stream.

If the codeword length $N_{encoded}$ and the information data size $N_{Info}$ satisfy $(2k+1)N_{Info} < N \leq (2k+2)N_{Info}$ (k is an integer), a $(2k+1)^{th}$ repeated block may be a repetition of information data and a $(2k+2)^{th}$ repeated block may be a bit stream obtained by bit-inverting the information data and then puncturing the bit-inverted information data to match $N_{encoded}$. That is, $N_{encoded}$−$(2k+1)N_{Info}$ bits of the information data are punctured for the last repeated block to match $N_{encoded}$. Or the $(2k+1)^{th}$ repeated block may be a repetition of a bit-inverted block of the information data and the $(2k+2)^{th}$ repeated block may be a bit stream obtained by partially puncturing the information data according to $N_{encoded}$. Or if the difference between the number of bit-inverted repeated blocks and the number of non-bit-inverted repeated blocks is 2 or larger in 2K repeated blocks, repeated blocks having the smaller proportion may be set as both the $(2k+1)^{th}$ and $(2k+2)^{th}$ repeated blocks. Puncturing is the process of deleting as many bits as needed from the start of end of the information bit stream or from arbitrary contiguous or non-contiguous positions of the information bit stream.

In both cases where $N_{encoded}$ is 24 and 48, the minimum distances between codewords according to information data sizes may be given as illustrated in Table 11 and Table 12 in the repetition coding scheme of the present invention. Table 11 is for the case of $N_{encoded}$=24 and Table 12 is for the case of $N_{encoded}$=48.

TABLE 11

| | Information data size | | | | |
|---|---|---|---|---|---|
| | 1 | 2 | 3 | 4 | 5 |
| Minimum distance | 12 | 12 | 12 | 12 | 8 |

TABLE 12

| | Information data size | | | | |
|---|---|---|---|---|---|
| | 1 | 2 | 3 | 4 | 5 |
| Minimum distance | 24 | 24 | 24 | 24 | 18 |

Even when two or more channel coding schemes are selectively used according to an information data size $N_{Info}$, the minimum distance between codewords can be increased. For example, if $N_{Info}$=1, the conventional repetition coding scheme may be used, while if $N_{Info}$ is 2 or larger, the repetition coding scheme of the present invention may be used. When this combined channel coding scheme is used in both cases where $N_{encoded}$ is 24 and 48, the minimum distances between codewords according to information data sizes may be given as illustrated in Table 13 and Table 14. Table 13 is for the case of $N_{encoded}$=24 and Table 14 is for the case of $N_{encoded}$=48.

TABLE 13

| | Information data size | | | | |
|---|---|---|---|---|---|
| | 1 | 2 | 3 | 4 | 5 |
| Minimum distance | 24 | 12 | 12 | 12 | 8 |

TABLE 14

| | Information data size | | | | |
|---|---|---|---|---|---|
| | 1 | 2 | 3 | 4 | 5 |
| Minimum distance | 48 | 24 | 24 | 24 | 18 |

Figure 29:
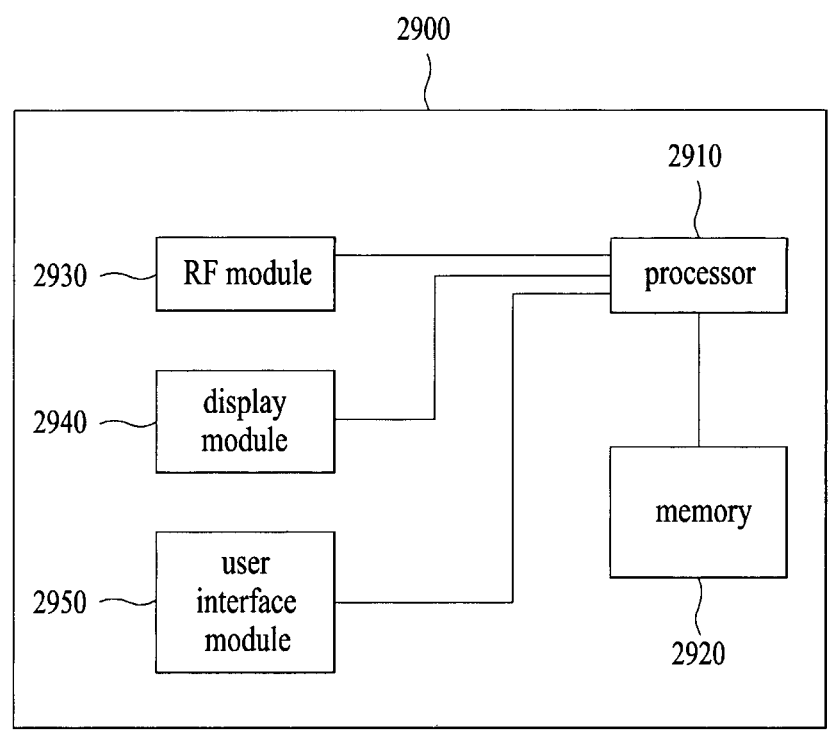
FIG. 29 is a block diagram of a communication apparatus according to an embodiment of the present invention.

FIG. 29 is a block diagram of a communication apparatus according to an embodiment of the present invention.

Referring to FIG. 29, a communication apparatus 2900 includes a processor 2910, a memory 2920, an RF module 2930, a display module 2940, and a user interface module 2950.

The communication apparatus 2900 is shown in FIG. 29 as having the above configuration, for the convenience' sake. Thus some modules may be omitted or added from or to the configuration of the communication apparatus 2900. In addition, some modules of the communication apparatus 2900 may further be branched. The processor 2910 is configured so as to perform operations according to the foregoing embodiments of the present invention. For detailed operations of the processor 2910, the descriptions given with reference to FIGS. 1 to 28 may be referred to.

The memory 2920 is connected to the processor 2910 and stores an operating system, applications, program code, and data. The RF module 2930, which is connected to the processor 2910, upconverts a baseband signal to an RF signal or downconverts an RF signal to a baseband signal. For the operations, the RF module 2930 performs analog conversion, amplification, filtering, and frequency upconversion or performs these processes reversely. The display module 2940 is connected to the processor 2910 and displays various types of information. The display module 2940 may be configured using, but not limited to, a Liquid Crystal Display (LCD), a Light Emitting Diode (LED), an Organic Light Emitting Diode (OLED), etc. The user interface module 2950 is connected to the processor 2910 and may be configured into a combination of known user interfaces such as a keypad, a touch screen, etc.

INDUSTRIAL APPLICABILITY

A method and apparatus for transmitting a signal using repetition coding in a wireless communication system according to the present invention are applicable to wireless communication systems, particularly to wireless mobile communication devices in a cellular system.

The embodiments of the present invention described hereinbelow are combinations of elements and features of the present invention. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present invention or included as a new claim by a subsequent amendment after the application is filed.

In the embodiments of the present invention, a description has been mainly made of a data transmission and reception relationship between a BS and an MS. A specific operation described as being performed by the BS may be performed by an upper node of the BS. Namely, it is apparent that, in a network comprised of a plurality of network nodes including a BS, various operations performed for communication with an MS may be performed by the BS, or network nodes other than the BS. The term 'BS' may be replaced with a fixed station, a Node B, an evolved Node B (eNB or eNode B), an access point, etc. The term 'UE' may be replaced with a Mobile Station (MS), a Subscriber Station (SS), a Mobile Subscriber Station (MSS), etc.

The embodiments of the present invention may be achieved by various means, for example, hardware, firmware, software, or a combination thereof. In a hardware configuration, the embodiments of the present invention may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the embodiments of the present invention may be implemented in the form of a module, a procedure, a function, etc. For example, software code may be stored in a memory unit and executed by a processor. The memory unit is located at the interior or exterior of the processor and may transmit and receive data to and from the processor via various known means.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

The invention claimed is:

1. A method for transmitting information data using a repetition coding scheme in a wireless communication system, the method comprising:
generating a codeword of a predetermined size $N_{encoded}$ by encoding information data of a size $N_{info}$; and
transmitting the codeword to a receiver,
wherein the codeword includes a plurality of repeated blocks based on the information data and if the information data includes an odd number of 1s, odd-numbered repeated blocks among the plurality of repeated blocks are bit-inverted data of the information data.

2. The method according to claim 1, wherein if the information data size $N_{info}$ and the codeword size $N_{encoded}$ satisfy $2kN_{Info} < N_{encoded} < (2k+1)N_{Info}$ (k is an integer), a $(2k+1)^{th}$ repeated block is created by bit-inverting the information data and puncturing $N_{encoded} - 2kN_{Info}$ bits of the bit-inverted information data.

3. The method according to claim 1, wherein if the information data size $N_{info}$ and the codeword size $N_{encoded}$ satisfy $(2k+1)N_{Info} < N_{encoded} < (2k+2)N_{Info}$ (k is an integer), a $(2k+2)^{th}$ repeated block is created by puncturing $N_{encoded}-(2k+1)N_{Info}$ bits of the information data.

4. The method according to claim 1, wherein if the information data size $N_{info}$ and the codeword size $N_{encoded}$ satisfy $(2k+1)N_{Info}<N_{encoded}<(2k+2)N_{Info}$ (k is an integer), a $(2k+1)^{th}$ repeated block and a $(2k+2)^{th}$ repeated block are non-bit-inverted data of the information data, and wherein the $(2k+2)^{th}$ repeated block is created by puncturing $N_{encoded}-(2k+1)N_{Info}$ bits of the information data.

5. The method according to claim 1, further comprising interleaving the codeword on a repeated block basis.

6. A transmission apparatus in a wireless communication system, comprising:

a processor for generating a codeword of a predetermined size $N_{encoded}$ by encoding information data of a size $N_{info}$; and a transmission module for transmitting the codeword to a receiver, wherein the codeword includes a plurality of repeated blocks based on the information data and if the information data includes an odd number of is, odd-numbered repeated blocks among the plurality of repeated blocks are bit-inverted data of the information data.

7. The transmission apparatus according to claim 6, wherein if the information data size $N_{info}$ and the codeword size $N_{encoded}$ satisfy $2kN_{Info}<N_{encoded}<(2k+1)N_{Info}$ (k is an integer), a $(2k+1)^{th}$ repeated block is created by bit-inverting the information data and puncturing $N_{encoded}-2kN_{Info}$ bits of the bit-inverted information data.

8. The transmission apparatus according to claim 6, wherein if the information data size $N_{info}$ and the codeword size $N_{encoded}$ satisfy $(2k+1)N_{Info}<N_{encoded}<(2k+2)N_{Info}$ (k is an integer), a $(2k+2)^{th}$ repeated block is created by puncturing $N_{encoded}-(2k+1)N_{Info}$ bits of the information data.

9. The transmission apparatus according to claim 6, wherein if the information data size $N_{info}$ and the codeword size $N_{encoded}$ satisfy $(2k+1)N_{Info}<N_{encoded}<(2k+2)N_{Info}$ (k is an integer), a $(2k+1)^{th}$ repeated block and a $(2k+2)^{th}$ repeated block are non-bit-inverted data of the information data, and wherein the $(2k+2)^{th}$ repeated block is created by puncturing $N_{encoded}-(2k+1)N_{Info}$ bits of the information data.

10. The transmission apparatus according to claim 6, wherein the processor interleaves the codeword on a repeated block basis.

* * * * *